United States Patent
Grossniklaus et al.

(10) Patent No.: US 9,766,312 B2
(45) Date of Patent: Sep. 19, 2017

(54) EASILY ACCESSIBLE DEEP-FROZEN NMR SHIM ARRANGEMENT

(71) Applicant: Bruker BioSpin AG, Faellanden (CH)

(72) Inventors: Beat Grossniklaus, Neerach (CH); Guenter Kuebler, Egg (CH); Pierre-Alain Bovier, Zuerich (CH)

(73) Assignee: Bruker BioSpin AG, Faellanden (CH)

( * ) Notice: Subject to any disclaimer, the term of this patent is extended or adjusted under 35 U.S.C. 154(b) by 0 days.

(21) Appl. No.: 15/381,174

(22) Filed: Dec. 16, 2016

(65) Prior Publication Data
US 2017/0176554 A1    Jun. 22, 2017

(30) Foreign Application Priority Data
Dec. 17, 2015    (DE) .................. 10 2015 225 731

(51) Int. Cl.
*G01V 3/00*    (2006.01)
*G01R 33/38*    (2006.01)
*G01R 33/3815*    (2006.01)

(52) U.S. Cl.
CPC ..... *G01R 33/3804* (2013.01); *G01R 33/3815* (2013.01)

(58) Field of Classification Search
CPC ................................................. G01R 33/3804
(Continued)

(56) References Cited

U.S. PATENT DOCUMENTS 5,389,909 A * 2/1995 Havens .............. G01R 33/3873
324/320
5,677,660 A * 10/1997 Ariyoshi ............ G01R 33/3875
324/320
(Continued)

FOREIGN PATENT DOCUMENTS

DE    10104054 C1    7/2002
DE    10116505 A1    10/2002
(Continued)

OTHER PUBLICATIONS

English translation of Office Action in corresponding German Application No. 102015225731.2, dated Oct. 5, 2016.
(Continued)

*Primary Examiner* — Louis Arana
(74) *Attorney, Agent, or Firm* — Edell, Shapiro & Finnan, LLC (57) ABSTRACT

An NMR apparatus includes a superconducting magnet coil system configured to generate a homogeneous magnetic field, and a helium (He) tank having an inner tube mechanically rigidly connected to the He tank and in which the magnet coil system is positioned. The He tank is configured to contain liquid helium to cool the magnet coils. A radiation shield has a radiation shield inner tube encompassing the He tank and spaced from the He inner tube to create a space between the He inner tube and the radiation shield inner tube to reduce an evaporation rate of the liquid helium. The NMR apparatus additionally includes a field shaping device with a magnetic material arranged in the space, in order to shim the homogeneous magnetic field. The field shaping device is fixed in the space so as to be in rigid mechanical contact with the He tank but without contacting the radiation shield.

13 Claims, 8 Drawing Sheets

(58) Field of Classification Search
USPC .................................................. 324/320, 319
See application file for complete search history.

(56) References Cited

U.S. PATENT DOCUMENTS

| | | | |
|---|---|---|---|
| 6,617,853 | B2 | 9/2003 | Bovier et al. |
| 6,897,750 | B2 | 5/2005 | Neuberth |
| 7,961,067 | B2 | 6/2011 | Chiba et al. |
| 2008/0191698 | A1 | 8/2008 | Nogami |
| 2009/0009171 | A1* | 1/2009 | Tamura .............. G01R 33/3873 324/320 |
| 2011/0084206 | A1 | 4/2011 | Neuberth et al. |
| 2013/0157865 | A1* | 6/2013 | Shen .................. G01R 33/3804 505/162 |
| 2014/0125342 | A1 | 5/2014 | Bovier et al. |
| 2014/0155268 | A1* | 6/2014 | Shen ................ G01R 33/34023 505/162 |

FOREIGN PATENT DOCUMENTS

| | | |
|---|---|---|
| DE | 102009045774 B4 | 7/2012 |
| DE | 102012220126 A1 | 5/2014 |
| JP | 200037366 B2 | 2/2000 |
| JP | 3737636 B2 | 1/2006 |

OTHER PUBLICATIONS

European Search Report in counterpart International Application No. 16202858.3, dated May 11, 2017, 6 pages; 1 English page translation.

* cited by examiner

EASILY ACCESSIBLE DEEP-FROZEN NMR SHIM ARRANGEMENT

CROSS REFERENCE TO RELATED APPLICATIONS

This application claims foreign priority under 35 U.S.C. §119(a)-(d) to German Application No. 10 2015 225 731.2 filed on Dec. 17, 2015, the entire contents of which are hereby incorporated into the present application by reference.

FIELD OF THE INVENTION

The invention relates to a magnet arrangement in an nuclear magnetic resonance (NMR) apparatus having a superconducting magnet coil system for generating a homogenous magnetic field in the direction of a z-axis, wherein the magnet coil system is arranged in a He tank with a He inner tube, which in operation contains liquid helium for cooling the coils, and is mechanically rigidly connected to the He tank, wherein a radiation shield with a radiation shield inner tube encompasses the He tank at a distance in order to reduce the evaporation rate of the liquid helium, and wherein a field shaping device made from soft magnetic material is arranged in the space between the He inner tube and the radiation shield inner tube in order to shim the homogeneous magnetic field.

BACKGROUND

Applications of superconducting magnet systems include magnetic resonance methods. In order to achieve good resolution in such a method, the magnetic field in a sample volume must have a high degree of homogeneity. The basic homogeneity of the superconducting magnet can be optimized with the geometric arrangement of the field-generating magnet coils.

Frequently, gaps are provided in the magnet coils (so-called notch structures), in which no wire is wound, in order to improve the homogeneity of the magnetic field. As a result, however, valuable space for magnet windings is lost, which makes the magnet more expensive and increases the stray field. In an arrangement according to U.S. Pat. No. 6,617,853 B2, a superconducting magnet for high-resolution spectroscopy is made more compact in that one or more soft magnetic rings, which adopt the role of certain notch structures in the magnet coils, are provided.

The z-component of the magnetic field of an arrangement according to U.S. Pat. No. 6,617,853 B2 can be expanded in the sample volume in a series of spherical harmonics:

$$B_z(r, z, \varphi) = \sum_{n=0}^{\infty} \sum_{m=0}^{n} P_n^m\left(\frac{z}{\sqrt{r^2 + z^2}}\right)(r^2 + z^2)^{n/2}(A_{nm}\cos(m\varphi) + B_{nm}\sin(m\varphi)),$$

where, according to design, the coefficients $A_{nm}$ with $m \neq 0$ and all coefficients $B_{nm}$ disappear. Due to manufacturing tolerances in the magnet arrangement, the coefficients $A_{nm}$ and $B_{nm}$ differ from the calculated value. Shim coils, which can each be energized with their own current, are normally used to correct these non-disappearing coefficients. In the case where the coefficients differ greatly from their desired value, it may be that the current needed in certain shim coils is too high and the magnetic field of the magnet arrangement cannot be corrected as required. Alternatively, it may be that the problematic coefficient in the expansion of the magnetic field in a series of spherical harmonics cannot be corrected as no shim coil is provided for it. In such a situation, an expensive repair to the magnet system, in which part of the magnet arrangement has to be replaced, is necessary.

Suitable field shaping devices made from soft magnetic material are provided in order to improve the magnetic field homogeneity without winding new magnet coils.

Different types of field shaping devices made from sheet metal or foil are described in DE 10 16 505 A1. Special cases, in which the sheet metal or foils have cut-out rectangular windows, are specified in JP 4384220 B2. Non-continuous holes in the sheet metal are also disclosed in DE 10 2012 220 126 A1.

Specially formed field shaping devices can also be provided in order to dispense with the notch structures in superconducting magnet coils described above in order, in turn, to make the magnet more compact, as explained in DE 10 104 054 C1, for example.

A further aspect of field shaping devices is discussed in JP 3737636 B2: The saturation magnetization of the soft magnetic material is temperature-dependent. This dependency is particularly pronounced at high temperatures, such as room temperature for example. Due to the variable saturation magnetization, small temperature variations of the field shaping device then cause a change in the field in the working volume, which can adversely affect the NMR measurement.

To counteract this, it is proposed to accommodate the field shaping device in the He tank. The ideal prerequisites for stable conditions are created due to the low temperature of the field shaping device and its cooling by the liquid helium. However, as the field shaping device can only be sized after measuring the field in the working volume, the cryostat must be warmed up and completely dismantled after a first magnet test before the field shaping device can be mounted in the helium tank. Such an operation costs time and money.

As a possible solution, DE 10 2012 220 126 A1 also proposes cooling of the field shaping device to the temperature of the liquid helium in order to improve the magnetic properties of the field shaping device. As an alternative to this, it is proposed in DE 10 2012 220 126 A1 that the field shaping device be accommodated in a region of the magnet arrangement which is at room temperature, so that, in the operating state, the components of the field shaping device are easily accessible from outside the arrangement and can be modified without warming up the magnet coil system.

As an alternative solution, JP 3737636 B2 proposes that the field shaping device be glued to the inner tube of the nitrogen tank which encompasses the He tank. This inner tube is provided for keeping the radiation of the room temperature inner tube away from the He tank and is therefore also referred to below as a radiation shield inner tube. With a suitable design of the cryostat, it is only necessary to warm up and not completely dismantle the cryostat following a first magnet test in order to mount the field shaping device. Unfortunately, however, this solution has a major disadvantage, namely, when changes occur to the nitrogen filling level, the nitrogen tank moves, and with it, naturally, also the inner tube with the fitted field shaping device. This movement then results in a considerable variation in the magnetic field homogeneity in the working volume, which is unacceptable in many applications.

SUMMARY

The present invention significantly increases the magnetic field homogeneity in the working volume in a superconducting magnet arrangement by use of a field shaping device that is technically straight-forward and without increasing the volume of the magnet arrangement. For retrofitting or for adjustment purposes, the field shaping device is easily accessible from outside the arrangement without requiring elaborate dismantling of the cryostat, in particular of the He tank or the magnet arrangement.

Embodiments presented herein are both relatively straight-forward to implement and effective in that the field shaping device is fixed in the space between the He inner tube and the radiation shield inner tube such that it is in rigid mechanical contact with the He tank but without at the same time touching the radiation shield inner tube. The abovementioned disadvantages of the prior art are therefore avoided by the embodiments presented herein, in that the field shaping device is mechanically decoupled from the nitrogen tank but is nonetheless positioned outside the He tank.

Further advantages compared with the prior art include:

As the superconducting magnet coil system is likewise rigidly connected to the He tank, the movement of the field shaping device relative to the superconducting magnet coil system is prevented, as a result of which the homogeneity in the working volume remains stable. A good thermal contact of the field shaping device to the He tank is not absolutely necessary, as its temperature adjusts itself even without thermal contact with the He tank due to the combined radiation of the He inner tube and the radiation shield inner tube. In the operating state, both inner tubes are at a very constant cryogenic temperature, as a result of which the temperature of the field shaping device likewise remains highly stable.

This enables a wealth of different fixing options for the field shaping device to the He tank. The materials used here do not necessarily have to have a good thermal conductivity. Thermally poor contact surfaces are also permissible as long as the rigid mechanical connection to the He tank is guaranteed.

In most cryostats, the radiation shield inner tube is fixed mechanically rigidly and in thermal contact with a tank of liquid nitrogen. The thermal contact gives the radiation shield inner tube its low temperature. This low temperature is decisive for low radiation input into the He tank, which minimizes the He losses.

In other cryostats, the radiation shield inner tube is brought to its operating temperature by a thermal contact with a cryocooler. This temperature can be even lower than that of the liquid nitrogen, which additionally reduces the He losses. Such cryostats also have the advantage that they require no space for the liquid nitrogen, which enables more compact cryostats to be designed.

Advantageous in a magnet arrangement according to the invention is also a field shaping device which contains a cylindrical body made from soft magnetic material. Such a body has the ideal shape to be positioned between He inner tube and radiation shield inner tube. The production of such a body is also relatively simple.

Non-cylindrically symmetrical cutouts in the cylindrical body have the advantage of providing great flexibility for shimming the magnetic field in the working volume. These cutouts can be through-holes or not. Through-holes are easier to produce; however non-through-holes give more flexibility for the design of the field shaping device.

The field shaping device according to the invention described above must be arranged such that its position relative to the superconducting magnet coil system is always well-defined and remains constant in time in the operating state. There are several ways of realizing as described below.

One possibility is the use of a supporting tube to position at least some parts of the field shaping device. As a rule, these parts include one or more cylinders with or without cutouts. Preferably, they are well connected mechanically to the supporting tube. In the case of vertical systems, the inherent weight can be this mechanical connection. In the case of cylinders with cutouts, the orientation thereof is also important. An interlocking connection can be a solution for this. Alternatively, the supporting tube can also be soldered or glued to the cylinder/cylinders. For example, the supporting tube can be screwed to the bottom of the He tank. Solutions with a supporting tube on each side of the field shaping device are also possible.

A further possibility is to connect at least some parts of the field shaping device to the He inner tube by a clamping mechanism. A supporting tube can be omitted with this solution. With suitable design, these parts of the field shaping device can be removed once more if required.

In other embodiments of the invention, at least some parts of the field shaping device can be glued to the outer surface of the He inner tube. This solution has the advantage that these parts of the field shaping device are positioned mechanically stably with respect to the magnet coil system. However, it must be ensured that the used adhesive is suitable for low temperature applications.

In a further advantageous embodiment of the magnet arrangement according to the invention, the field shaping device contains a foil made of soft magnetic material which is arranged on a carrier tube. Like the supporting tube described above, the carrier tube is mechanically connected to the He tank. Each foil made of soft magnetic material can be designed individually, which gives more scope in design compared to a solution with one or more cylinders.

Particularly advantageously, the invention can be used with a magnet coil system which contains at least one coil which is wound with a high-temperature superconducting material. In the case of magnets with high-temperature superconductors, in particular tape conductors, the poor homogeneity is a major problem. One reason for this is that the superconducting layer in these conductors is typically several millimeters wide, thus enabling the superconducting current to be distributed inhomogeneously. This leads to greater potential field inhomogeneities in the working volume than with traditional low-temperature superconductors, in which the current-carrying filaments usually have a diameter of a few hundredths of a millimeter. Added to this is the fact that the electrical cryo shims, which are used to improve the homogeneity, are located radially further away from the magnet axis than the high-temperature superconductor. When they are operated with current, a current which screens the magnetic field of the shim in the working volume is induced in the high-temperature superconductor. Cryo shims are therefore often unable to compensate the magnetic field inhomogeneity in the working volume and alternative solutions must be sought.

In an embodiment, the magnet coil system has an active shield. This active shield reduces the stray field of the magnet arrangement so that more space is available in the laboratory for other applications.

Also advantageous is an embodiment of the magnet arrangement in which the field shaping device is magnetically fully saturated and is magnetized purely axially (in a direction along the z-axis). In this situation, the calculation of the field produced by the field shaping device is particularly easy and accurate.

Also advantageous is an embodiment of the magnet arrangement in which parts of the field shaping device have been subjected to surface treatment, in particular that these have been galvanized. This surface treatment forms an optimum protection against corrosion, which is indispensable particularly for parts made from soft iron.

Another embodiment of the magnet arrangement is distinguished in that the field shaping device comprises a plurality of elements made from magnetic material. This provides more degrees of freedom for optimizing the field shaping device.

The invention also includes a method for producing a magnet arrangement of the kind described above according to the invention which is distinguished in that at least some of the non-cylindrical symmetrical cutouts are removed by spark erosion. High mechanical accuracy can be achieved with spark erosion.

Alternatively, in another variant of the method, at least some of the non-cylindrically symmetrical cutouts are removed by an etching substance. Material can be removed in a simple way by an etching process in an acid bath by suitably covering areas of the field shaping device which do not require subsequent finishing. The etching time must be adjusted so that the correct thickness of material is removed.

A further alternative is provided by a method variant in which at least some of the non-cylindrically symmetrical cutouts are removed by electrolysis. Here, an electrolytic bath is used instead of an acid bath as in the above method variant.

Finally, in a further method variant, at least some of the non-cylindrically symmetrical cutouts can also be removed by grinding or milling. Grinding and milling are age-old methods which are commanded by every precision engineer. Furthermore, no special apparatus-related equipment is required for carrying out these processes.

In embodiments of the magnet arrangement which have non-cylindrically symmetrical cutouts in the form of through-holes through the field shaping device, the holes can also be cut out with a laser beam. A significant advantage of laser methods is the very high mechanical precision, which enables even complicated specified shapes to be produced extremely accurately.

Further advantages of the invention can be seen from the description and the drawing. Likewise, according to the invention, the characteristics stated above and the characteristics explained further can in each case be applied individually in their own right or jointly in any combination. The embodiments shown and described are not to be understood as a conclusive list, but rather they have an exemplary character for illustrating the invention.

BRIEF DESCRIPTION OF THE DRAWINGS

Embodiments are shown in the drawings and explained in more detail below. In the drawing.

DETAILED DESCRIPTION

Figure 1:
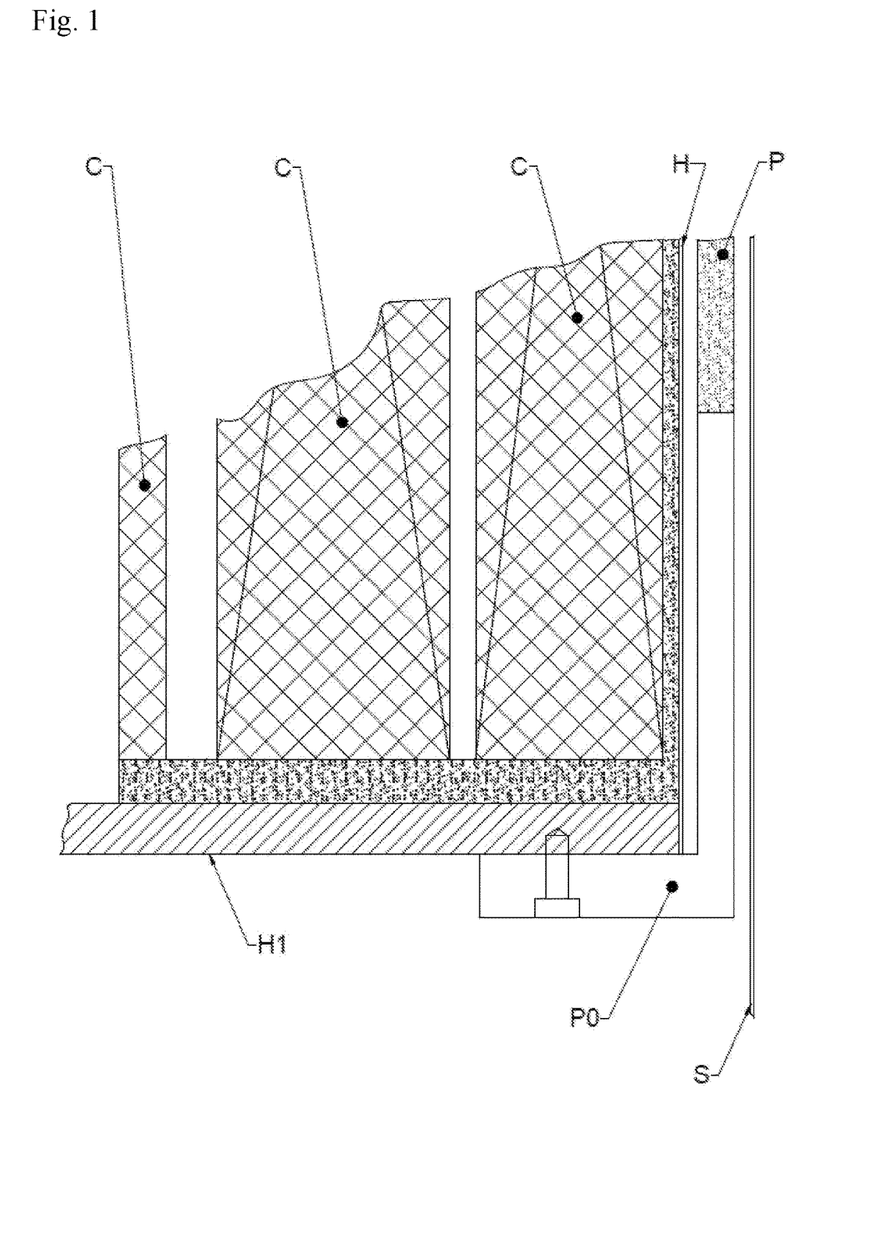
FIG. 1 shows a schematic vertical section through a radial half of the magnet arrangement according to an embodiment in which the field shaping device is fixed by a supporting tube to the bottom of the helium tank.

FIG. 1 shows a schematic vertical section through a radial half of the magnet arrangement according to an embodiment in which the field shaping device P is fixed by a supporting tube P0 to the bottom of the helium tank. The superconducting magnet coil system C is connected mechanically rigidly to the bottom of the He tank H1. For example, the supporting tube P0 can be screwed or glued to the bottom of the He tank. However, the screw connection is more advantageous since it can be fashioned to be releasable. The field shaping device P can be soldered or glued to the supporting tube P0. A bayonet connector is also suitable. Alternatively, the field shaping device P can be clamped between two supporting tubes.

Figure 2:
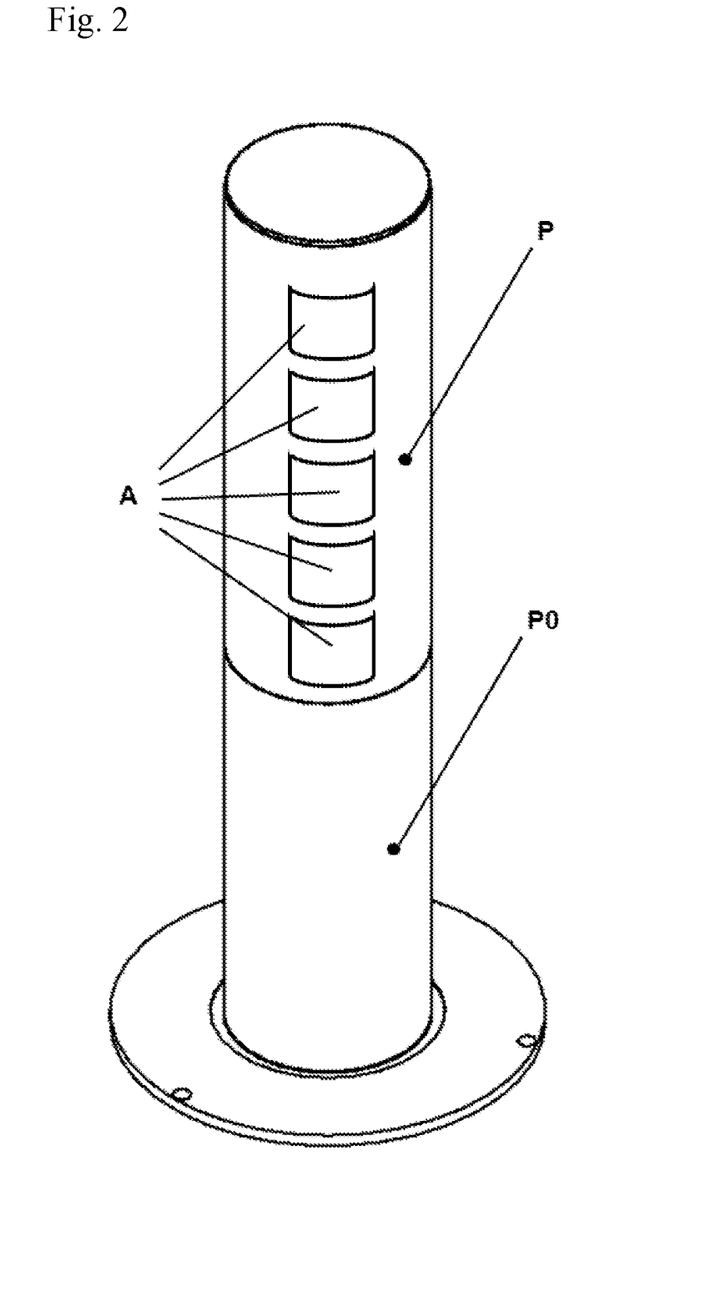
FIG. 2 shows a supporting tube with a field shaping device.

A supporting tube P0 and a field shaping device P are shown before assembly in FIG. 2. In this example, the field shaping device P is a cylinder with cutouts A.

Figure 3:
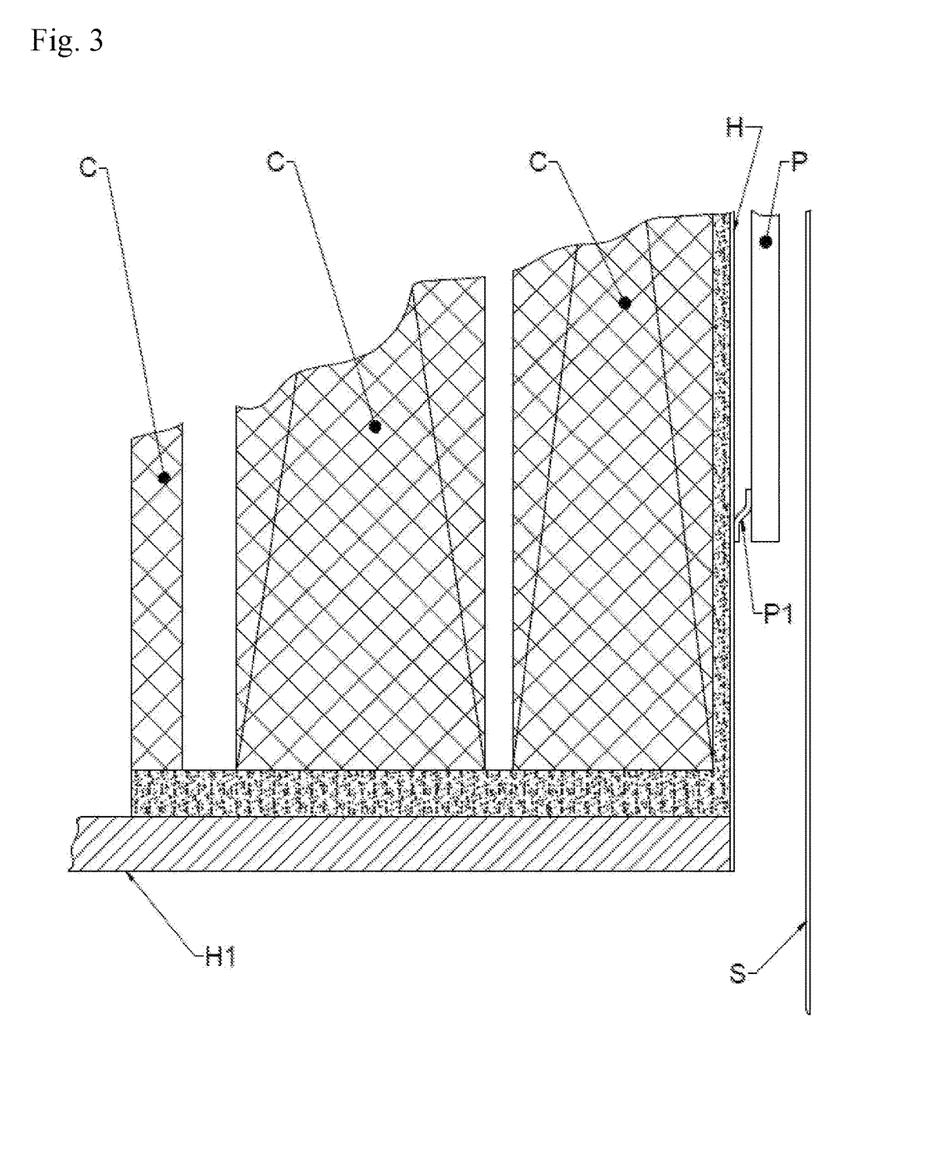
FIG. 3 shows a schematic vertical section through a radial half of the magnet arrangement according to an embodiment in which the field shaping device is fixed by a clamping mechanism to the He inner tube.

FIG. 3 shows a schematic vertical section through a radial half of the magnet arrangement according to an embodiment in which the field shaping device P is fixed by a clamping mechanism P1 to the He inner tube H. No supporting tube is necessary in this arrangement. The clamping mechanism P1 can be made either from the same or from a different material than the field shaping device P. When the same material is chosen, the field shaping device P and the clamping mechanism P1 can be made from a single workpiece. However, the influence of the clamping mechanism P1 on the magnetic field homogeneity in the working volume should be taken into account in the design of the field shaping device P.

Figure 4:
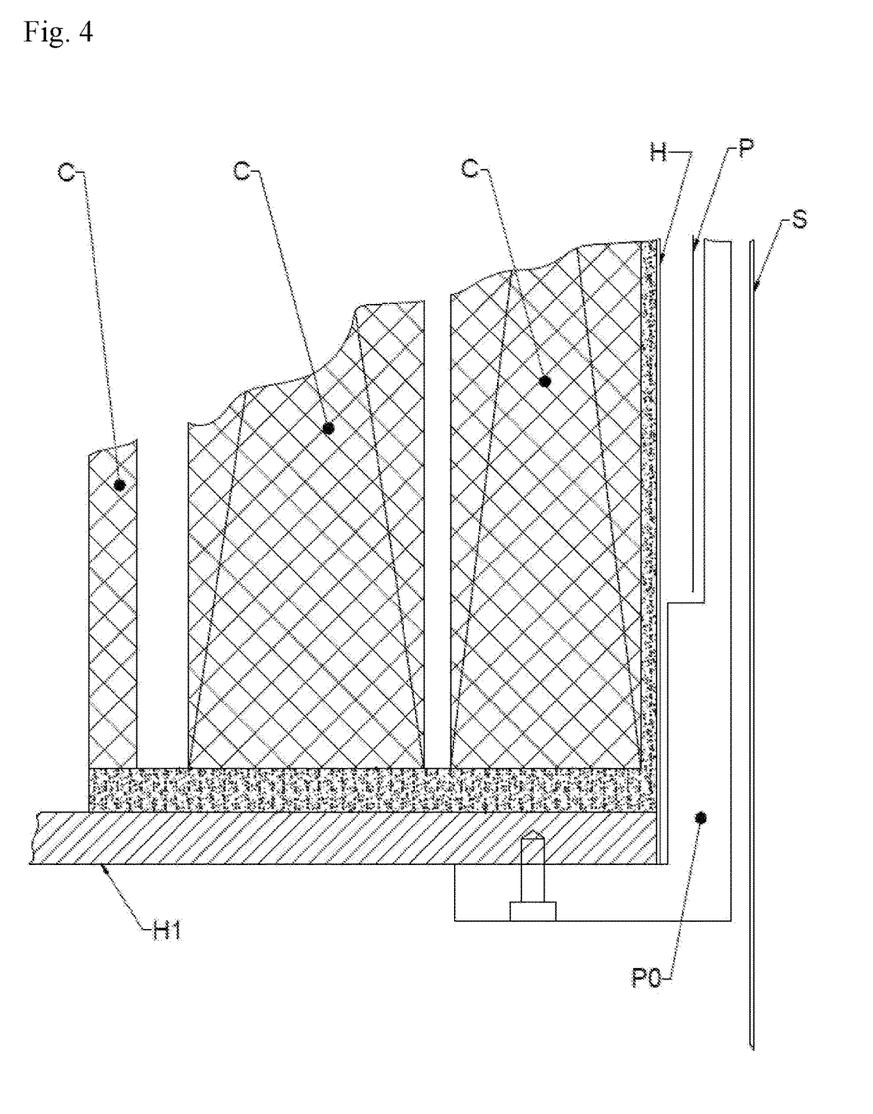
FIG. 4 shows a schematic vertical section through a radial half of the magnet arrangement according to an embodiment in which the field shaping device contains foils which rest on a carrier tube which is fixed to the bottom of the helium tank.

FIG. 4 shows a schematic vertical section through a radial half of the magnet arrangement according to an embodiment in which the field shaping device P contains foils which rest on a carrier tube P0 which is fixed to the bottom of the helium tank. A plurality of foils can also be arranged one above the other on the carrier tube, preferably with an adhesive tape which is suitable for low temperatures. The foils can assume different forms. For example, they can have holes with different patterns. They can cover the whole circumference of the carrier tube or only part thereof. Preferably, the carrier tube includes a groove for attaching soft magnetic foil. This ensures that the soft magnetic foil remains undamaged when inserting the carrier tube.

Figure 5:
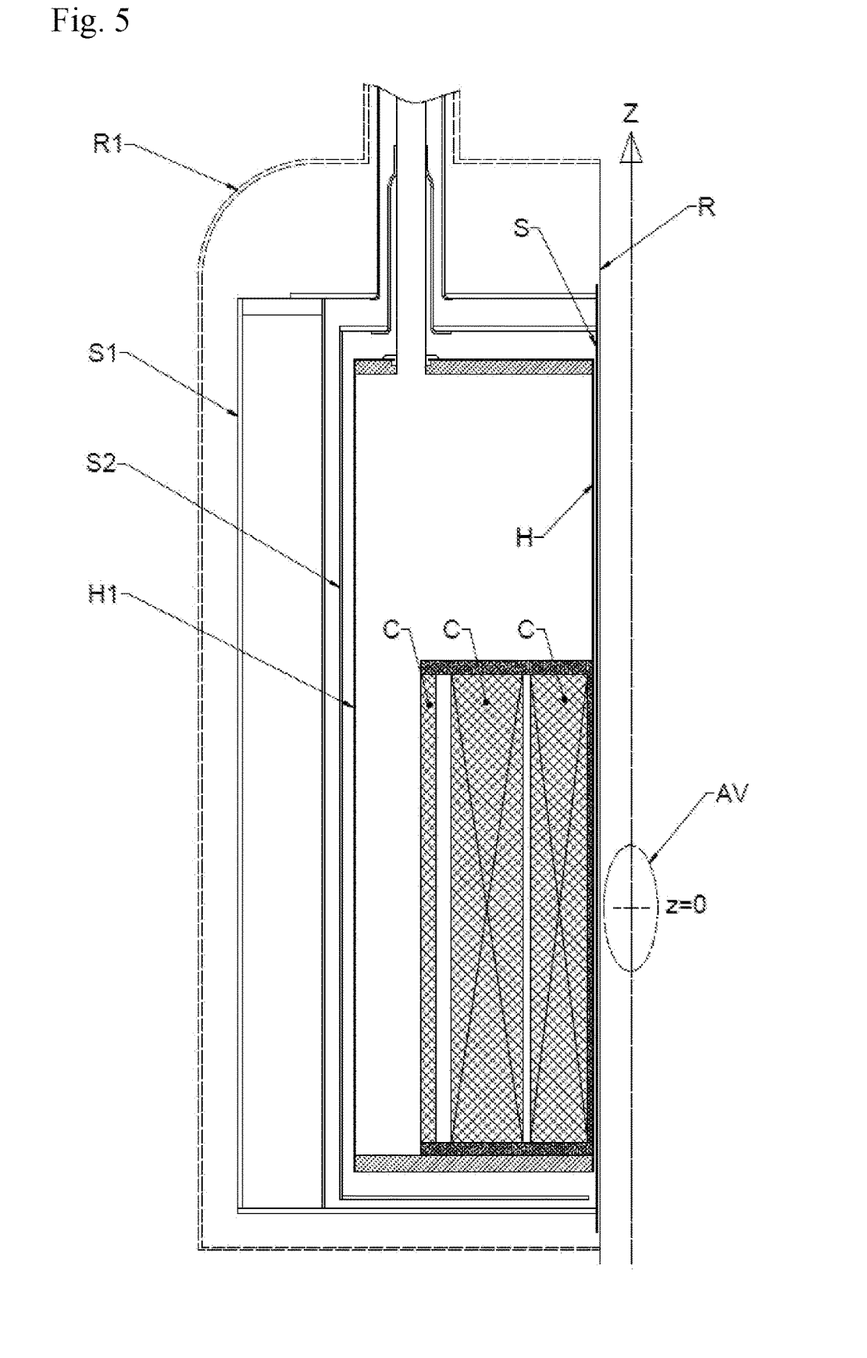
FIG. 5 shows a schematic vertical section through a radial half of the magnet arrangement according to an embodiment with a He tank, a radiation shield tank and a tank with liquid nitrogen.

FIG. 5 shows a schematic vertical section through a radial half of the magnet arrangement according to an embodiment with a superconducting magnet coil system C, a He tank H1, a radiation shield tank S2 and a tank S1 with liquid nitrogen. In this case, the radiation shield inner tube S is not part of the radiation shield tank S2 but is connected to the nitrogen tank S1 in a heat-conducting manner. A room-temperature tank R1 with inner tube R encompasses the nitrogen tank S1.

In operation, a vacuum prevails in the spaces between the tanks. The axis of symmetry z of the superconducting magnet coil system C and the working volume AV about the plane z=0 are likewise shown.

Figure 6:
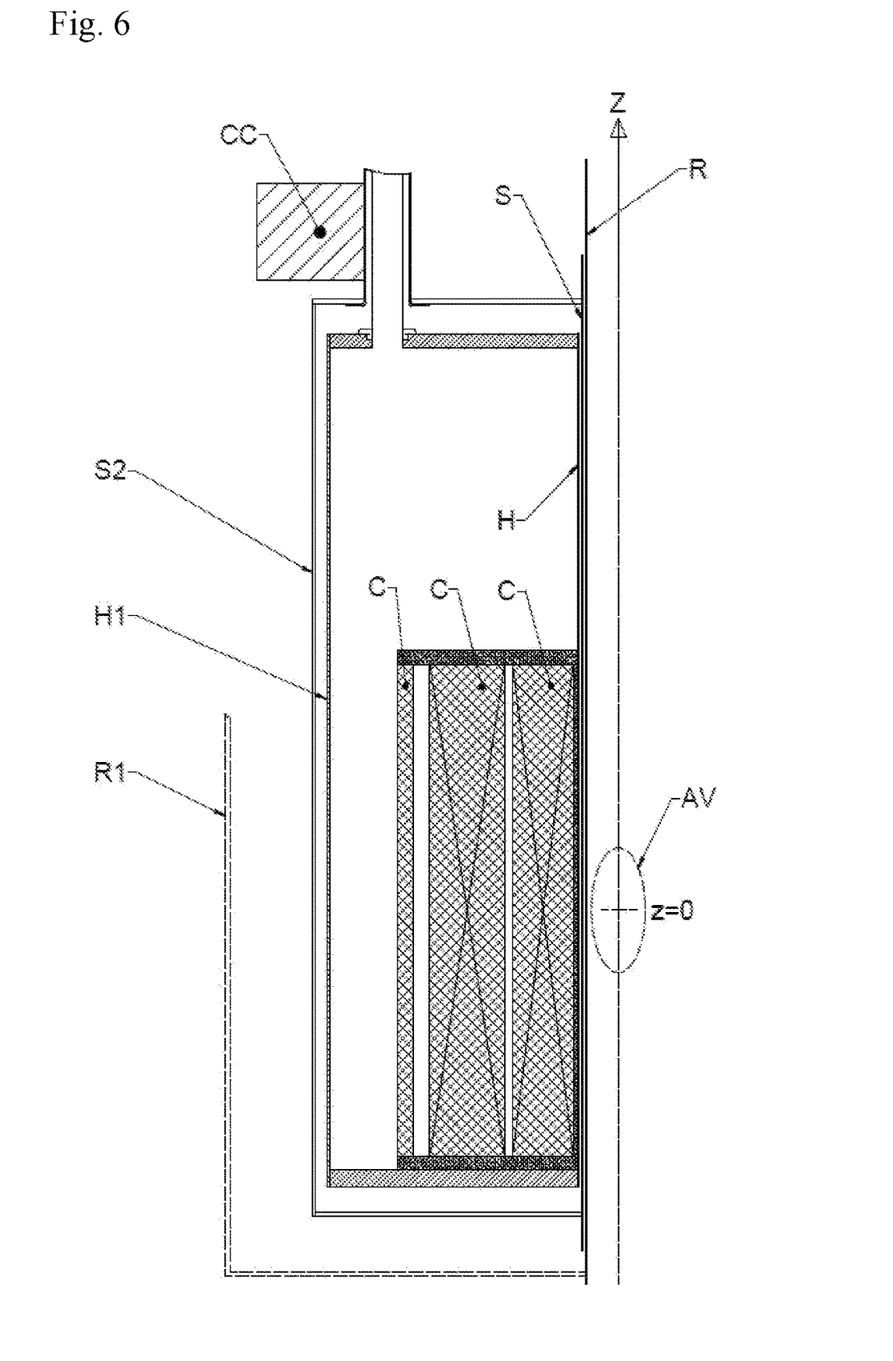
FIG. 6 shows a schematic vertical section through a radial half of the magnet arrangement according to an embodiment with a He tank and a radiation shield tank which is brought to its operating temperature with a cryocooler.

FIG. 6 shows a schematic vertical section through a radial half of the magnet arrangement according to an embodiment with a superconducting magnet coil system C, a He tank H1 and a radiation shield tank S2 which is brought to its operating temperature with a cryocooler CC; The radiation shield tank S2 is thermally connected to a radiation shield inner tube S. As in the above figure, the room temperature tank R1 with inner tube R, the axis of symmetry z and the working volume AV about the plane z=0 are also shown.

Figure 7:
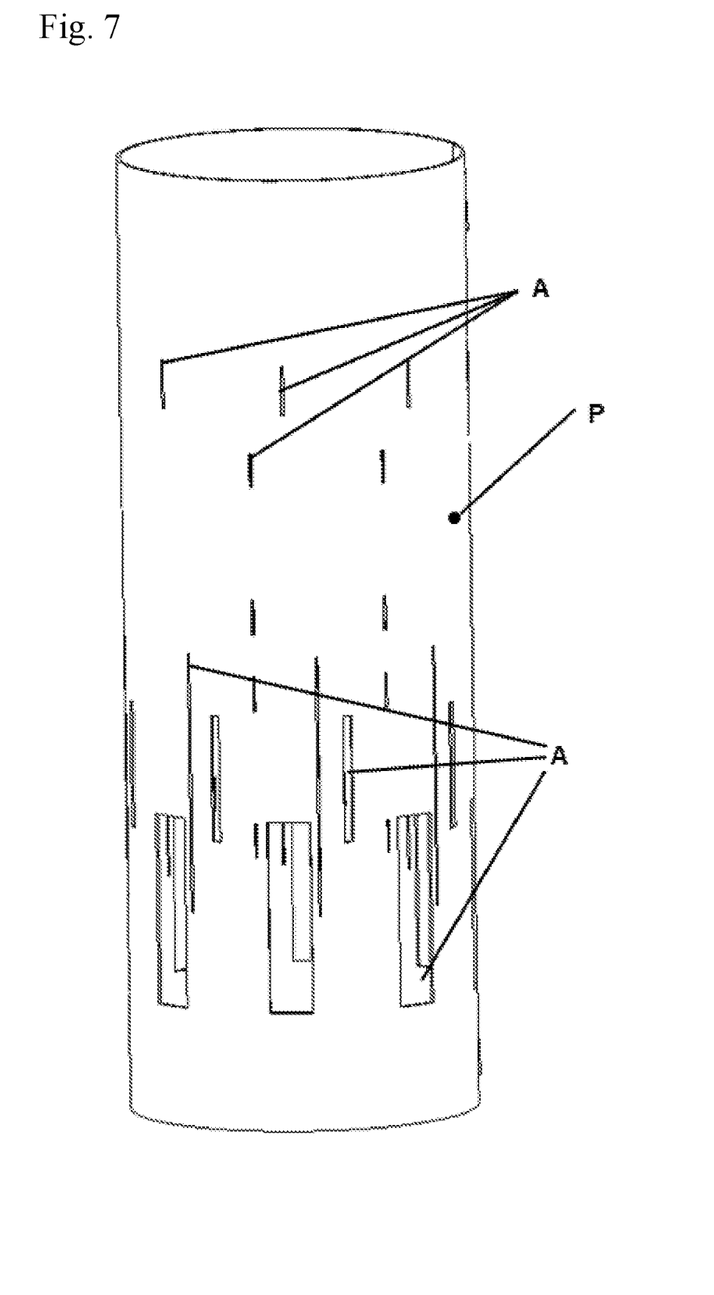
FIG. 7 shows a field shaping device with through-holes.

A field shaping device P with through-holes A is shown in FIG. 7. The through-holes A are determined in form and size such that the magnetic field in the working volume is as homogenous as possible.

Figure 8:
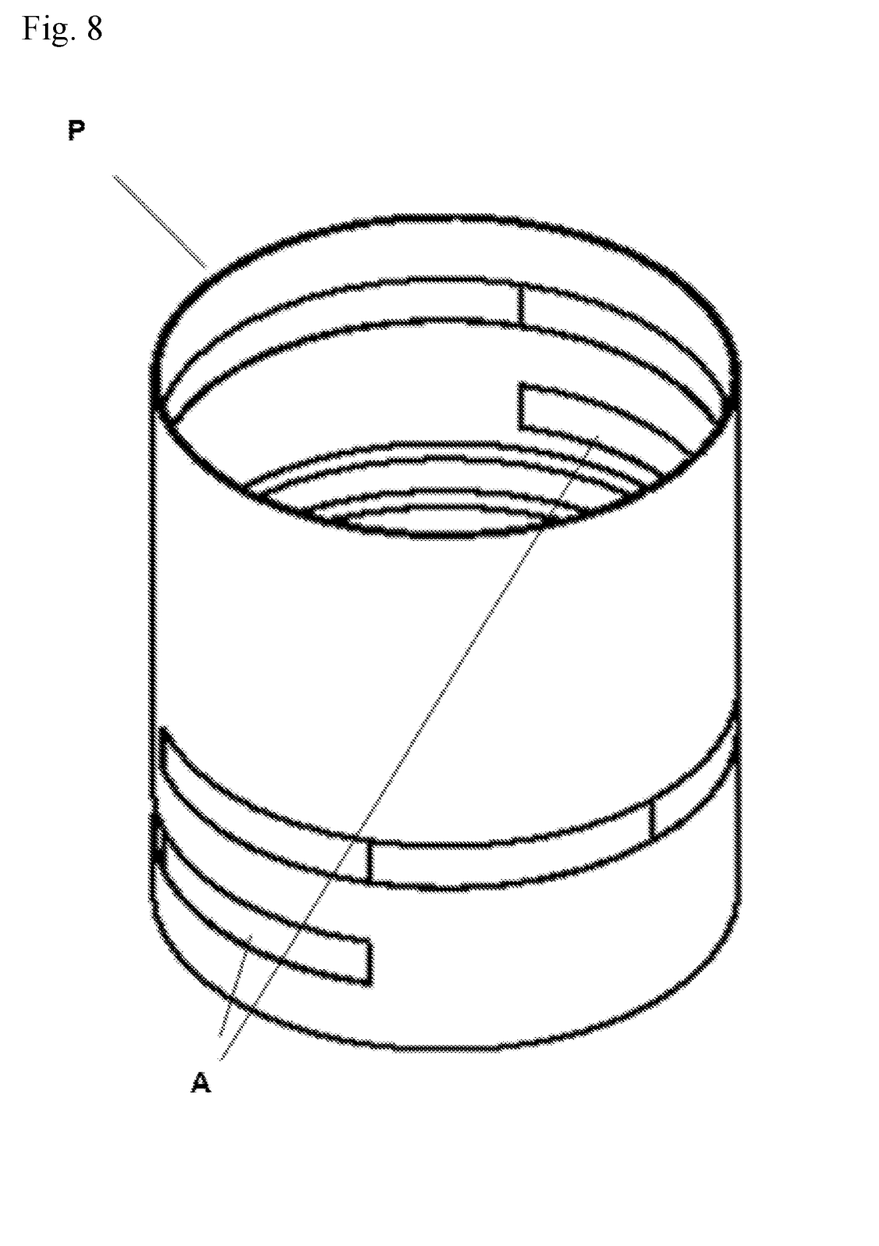
FIG. 8 shows a field shaping device with non-through-holes.

Finally, FIG. 8 shows a field shaping device P with non-through-holes A. These can be produced by an etching process or by spark erosion, for example.

In summary, and as illustrated through various embodiments, an NMR apparatus is provided that includes: a superconducting magnet coil system configured to generate a homogeneous magnetic field; a He tank (H1) having a He inner tube (H) mechanically rigidly connected to the He tank (H1) and in which the magnet coil system is positioned, wherein the He tank is configured to contain liquid helium, to cool the magnet coils; a radiation shield (R) having a radiation shield inner tube (S) encompassing the He tank (H1) and spaced from the He inner tube (H), to create a space between the He inner tube (H) and the radiation shield inner tube (S), to reduce an evaporation rate of the liquid helium; and a field shaping device (P) with a magnetic material arranged in the space in order to shim the homogeneous magnetic field. The field shaping device (P) is fixed in the space so as to be in rigid mechanical contact with the He tank (H1) without contacting the radiation shield.

LIST OF REFERENCES

C Magnet coil system
H He inner tube
H1 He tank
S Radiation shield inner tube
S1 Tank with liquid nitrogen
S2 Radiation shield tank
P Field shaping device
P0 Supporting tube, carrier tube
P1 Clamping mechanism
A Cutout
AV Working volume
R Room temperature inner tube
R1 Room temperature tank
CC Cryocooler

What is claimed is:

1. A nuclear magnetic resonance (NMR) apparatus, comprising:

a superconducting magnet coil system configured to generate a homogeneous magnetic field;

a helium (He) tank with a He inner tube mechanically rigidly connected to the He tank and in which the magnet coil system is positioned, wherein the He tank is configured to contain liquid helium to cool the magnet coil system;

a radiation shield having a radiation shield inner tube encompassing the He tank and separated from the He inner tube, thereby forming a space between the He inner tube and the radiation shield inner tube, in order to reduce an evaporation rate of the liquid helium; and a field shaping device comprising a magnetic material arranged in the space in order to shim the homogeneous magnetic field, wherein the field shaping device is fixed in the space to be in rigid mechanical contact with the He tank without contacting the radiation shield.

2. The apparatus according to claim 1, further comprising a tank of liquid nitrogen, wherein the radiation shield inner tube is fixed mechanically rigidly to and is in thermal contact with the tank of liquid nitrogen.

3. The apparatus according to claim 1, further comprising a cryocooler configured to bring the radiation shield inner tube to an operating temperature thereof by thermal contact.

4. The apparatus according to claim 1, wherein the field shaping device comprises a cylindrical body made from soft magnetic material.

5. The apparatus according to claim 4, wherein the cylindrical body of the field shaping device has non-cylindrically symmetrical cutouts therein.

6. The apparatus according to claim 4, further comprising a supporting tube to support and position the field shaping device.

7. The apparatus according to claim 4, further comprising a clamping mechanism configured to connect at least some parts of the field shaping device to the He inner tube.

8. The apparatus according to claim 4, wherein at least some parts of the field shaping device are glued to an outer surface of the He inner tube.

9. The apparatus according to claim 1, further comprising a supporting tube configured to support and position at least some parts of the field shaping device.

10. The apparatus according to claim 1, further comprising a clamping mechanism configured to connect at least some parts of the field shaping device to the He inner tube.

11. The apparatus according to claim 1, wherein at least some parts of the field shaping device are glued to an outer surface of the He inner tube.

12. The apparatus according to claim 1, wherein the field shaping device includes at least one foil made from soft magnetic material and arranged on a carrier tube.

13. The apparatus according to claim 1, wherein the superconducting magnet coil system includes at least one coil wound with high-temperature superconductor material.

* * * * *